United States Patent [19]
Elion et al.

[11] Patent Number: 5,127,059
[45] Date of Patent: Jun. 30, 1992

[54] AUDIO AMPLIFIERS

[75] Inventors: Clifford S. Elion, Van Nuys; John M. Robinson, Tujunga, both of Calif.

[73] Assignee: Gibson Guitar Corp., Nashville, Tenn.

[21] Appl. No.: 467,735

[22] Filed: Jan. 18, 1990

[51] Int. Cl.⁵ .......................... H03F 21/00; H03G 3/00
[52] U.S. Cl. ...................................... 381/120; 381/98; 381/61
[58] Field of Search ...................... 381/61, 63, 120, 98, 381/103

[56] References Cited

U.S. PATENT DOCUMENTS

| | | | |
|---|---|---|---|
| 4,495,640 | 1/1985 | Frey | 381/98 |
| 4,701,957 | 10/1987 | Smith | 381/61 |
| 4,935,875 | 6/1990 | Hayashi | 381/63 |

OTHER PUBLICATIONS

The Audio Cyclopedia by H. M. Tremaine, 1980, pp. 548-550, Model LA-2A leveling amplifier.
Noll, FET Principles, Experiments, and Projects, 1975, pp. 221-223.
Lancaster, CMOS Cookbook, 1979, pp. 349-355.

Primary Examiner—Forester W. Isen
Attorney, Agent, or Firm—Laney, Dougherty, Hessin & Beavers

[57] ABSTRACT

A pre-amplifier for musical instrument audio signals which utilizes a solid state programmable logic device to control a plurality of solid state switches for routing the audio signals in preselected manner through successive stages of vacuum tube amplification.

7 Claims, 4 Drawing Sheets

AUDIO AMPLIFIERS

BACKGROUND OF THE INVENTION

1. Field of the Invention

The invention relates generally to an improved audio preamplifier of the type used for receiving input of stringed instruments and, more particularly, but not by way of limitation, it relates to an audio switching and amplifying apparatus wherein solid state logic circuitry control signal amplification through multiple vacuum tube stages.

2. Description of the Prior Art

The use of vacuum tubes in musical instrument amplifiers and pre-amplifiers is quite old and well-known. Indeed, all amplifiers prior to the advent of solid state amplifiers in the late 1950's were constructed utilizing hard, vacuum tube technology. By the same token, solid state logic circuitry and programmable logic technology in general is quite commonplace today in digital electronics and particularly in digital computer design. However, Applicant does not know and has been unable to discover any teachings that would combine the two approaches, i.e., the use of programmable solid state logic circuitry in con-junction with vacuum tube amplifier design for music audio reproduction.

SUMMARY OF THE INVENTION

The present invention relates to improvements in vacuum tube amplifier control and fidelity by using programmable solid state logic circuitry in combination therewith. A programmable logic device provides sequenced output command pulses to logic switching circuitry which controls signal routing, gain control and signal combining through three vacuum tube gain stages. Output from the three gain stages is then applied through a multi-channel volume and tone control array whereupon the signal is input to a final output amplifier stage with cathode follower output to the next stages.

Therefore, it is an object of the present invention to provide a pre-amplifier for selectively providing multi-channel output of distinctly different instrument sounds.

It is also an object of the present invention to provide a pre-amplifier for guitar output signals that provides more efficient switching between channels and sounds.

It is still another object of the invention to enable a speaker contour filter for simulating the frequency response of a typical guitar speaker cabinet.

Finally, it is an object of the present invention to provide a logic controlled multi-channel pre-amplifier offering distinct sound selection and having provision for multiple effects loops.

Other objects and advantages of the invention will be evident from the following detailed description when read in conjunction with the accompanying drawings which illustrate the invention.

DETAILED DESCRIPTION OF THE INVENTION

Figure 1:
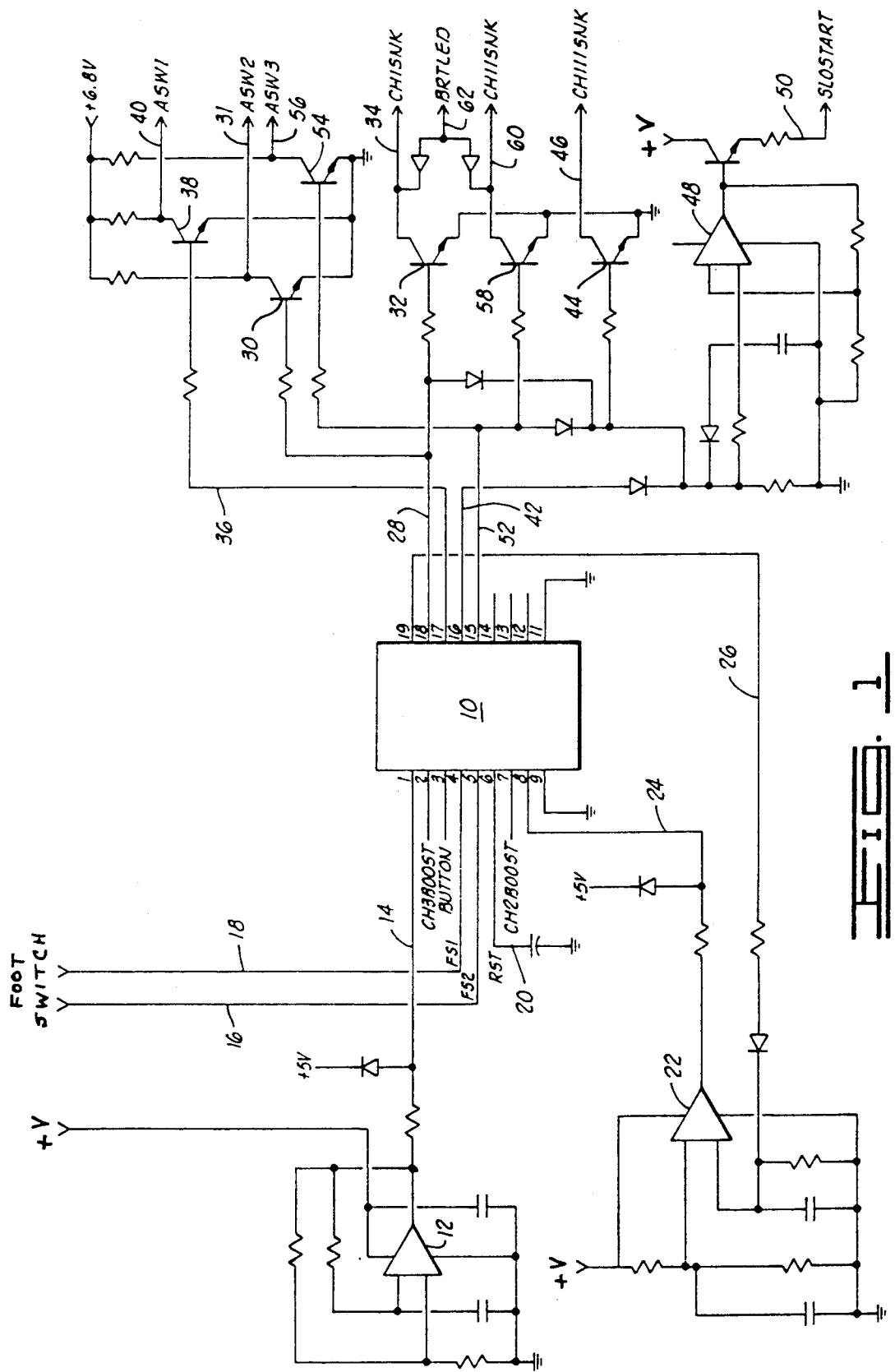
FIG. 1 is a schematic diagram of the programmable logic circuitry of the present invention.

Referring to FIG. 1, the logic control circuitry includes a programmable array logic device 10 that functions to control the front panel and foot switch decode logic for the pre-amplifier. Programmable logic device 10 is controlled by a clock generator, an op-amp oscillator 12 (type LN324AN) providing a clock pulse output on lead 14, e.g., 50 to 60 Hertz, for input to pin 1 of logic device 10. Other inputs applied to logic device 10 are CH3BOOST at pin 2, BUTTON at pin 3, FS1 at pin 4, and FS2 at pin 5 (footswitch inputs). A reset is input at pin 6 while CH2BOOST is input at pin 7. Pin 8 receives input of a delay signal from an op-amp comparator 22 (type LN324AN) via lead 24 and this signal effects a mute time-out.

Program control outputs from logic device 10 include a mute output on pin 19 and lead 26 for input to the delay comparator 22. Pin 18 provides a CHANNEL 1 output on lead 28 which is applied through a type 2N3904 transistor 30 to produce an ASW2 output (analog switch 2). Lead 28 is also applied to the base of yet another type 2N3904 transistor 32 to produce a CHISNK output (CHANNEL 1 turn-on) on collector output lead 34. Pin 17 provides output on lead 36 to a type 2N3904 transistor 38 which generates ASW1 output on lead 40. Pin 16 of logic device 10 provides output on a lead 42 to the base of another similar type transistor 44 to produce CHIISNK output on lead 46, and output lead 42 is also applied to energize an op-amp 48 to generate SLOSTART signal as output on lead 50. Finally, output pin 15 of logic device 10 connects to a lead 52 that is dually connected to the base of a type 2N3904 transistor 54 to generate ASW3 output at lead 56 and it is connected to the base of a similar transistor 58 to generate CHIISNK output on lead 60. An output 62 is diode connected to respective output leads 34 and 60 to conduct a BRTLED signal that is used to energize LED indicators throughout the circuitry.

The program for the programmable array logic device 10 is as follows:

```
/**   Inputs   **/
Pin 1  =  CLK         : /*System clock - approx 5 ms. */
Pin 2  =  CHA3DRIVE   : /*Front Panel DRIVE PULL
                         switch */
Pin 3  =  !BUTTON     :/*Front Panel select button */
Pin 4  =  SWA         ; /*Footswitch bit0 */
Pin 5  =  SWB         ; /*Footswitch bit1 */
Pin 6  =  !RESET      ; /*Not reset */
Pin 7  =  CHA2DRIVE   ; /*Front panel DRIVE PULL
                         switch */
Pin 8  =  DELAY       ; /*Mute timeout input */
/**   Outputs   **/
Pin 12 =  Q0          ; /*Machine */
Pin 13 =  Q1          ; /*State */
Pin 14 =  Q2          ; /*State */
Pin 15 =  CHANN2      ; /*OP1,3 */
Pin 16 =  CHANN3      ; /*OP2,6,ASW1 */
Pin 17 =  DRIVE       ; /*Selects DRIVE Circuit */
Pin 18 =  CHANN1      ;
Pin 19 =  MUTE        ; /*Starts mute timeout by strobing
                         one-shot */
/** Declarations and Intermediate Variable Definitions **/
field.      ampstate + [Q2..0]; /* State variables */
$define     CH1wt    'b' 000
$define     CH1      'b' 001
$define     CH2wt    'b' 010
$define     CH2      'b' 011
$define     CH3wt    'b' 100
$define     CH3      'b' 101
$define     ResetS   'b' 111
```

-continued

```
Sdefine    BadState  'b' 110
field      switch = [SWA,SWB];
           toch1 = switch:['b' 01];    /* Channel 1 */
           toch2 = switch:['b' 10];    /* Channel 2 */
           toch3 = switch:['b' 00];    /* Channel 3 */
/** Logic Equations **/
condition
    if RESET    out Q0.d out Q1.d out Q2.d out MUTE.d;
sequence ampstate
Present ResetS
    if !RESET   next CH1wt out MUTE.d out !DRIVE.d;
    if RESET    next ResetS;
present CH1wt
Out !CHANN1.d out !CHANN2.d out !CHANN3.d;
    if (BUTTON # DELAY)          next CH1wt;
    if !(BUTTON # DELAY)         next CH1;
present CH1
out CHANN1.d out !CHANN2.d out !CHANN3.d;
    if BUTTON # toch2            next CH2wt out MUTE.d;
    if toch3                     next CH3wt out MUTE.d;
    if !(BUTTON # toch2 # toch3) next CH1;
present CH2wt
out !CHANN1.d out !CHANN2.d out !CHANN3.d;
    if BUTTON # DELAY            next CH2wt;
    if !(BUTTON # DELAY)         next CH2;
present CH2
out !CHANN1.d out CHANN2.d out !CHANN3.d;
if !CHA2DRIVE out Drive.d;
    if BUTTON # toch 3           next CH3wt out MUTE.d;
    if toch1                     next CH1wt out MUTE.d;
    if !(BUTTON # toch1 # toch3) next CH2;
Present CH3wt
out !CHANN1.d out !chann2.d out !CHANN3.d;
    if BUTTON # DELAY            next CH3wt;
    if !(BUTTON # DELAY)         next CH3;
present CH3
out !CHANN1.d out !CHANN2.d out CHANN3.d;
if !CHA3DRIVE out DRIVE.d;
    if BUTTON # toch1            next CH1 wt out MUTE.d;
    if toch2                     next CH2wt out MUTE.d;
    if !(BUTTON # toch1 # toch2) next CH3;
```

Figure 2:
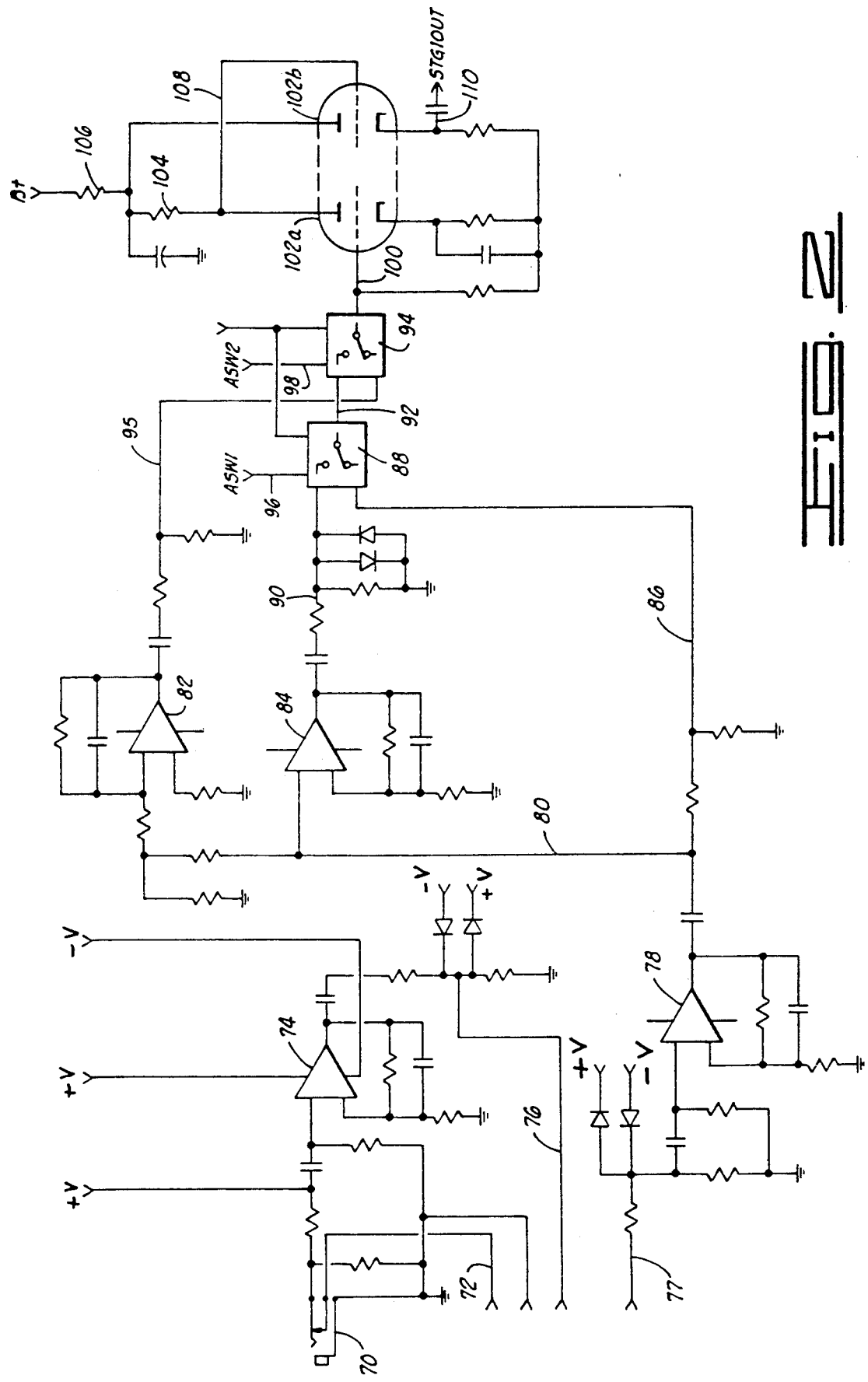
FIG. 2 is a schematic diagram of first stage amplifier of the invention.

FIG. 2 illustrates the input and first stage of the preamplifier. An input signal may be received at input jack 70 and/or a rear panel input 72, e.g., an auxiliary input for guitar or synthesizer. Such input is amplified in a solid state amplifier 74 (type TL074N QUAD AMP) whereupon a clamped output is derived on lead 76 for output to a tuner or other external means. Various types of external "effects" circuitry or devices may be utilized at this point for altering selected ones of sound characteristics. Signal is returned to the rear panel for input via lead 77 as it is applied as a clamped input to the positive terminal of a quad-amp 78 (type TL074N). The output of transistor amplifier 78 is then present on lead 80 for application to opposite inputs of amplifiers 82 and 84 (type TL074N) which function to amplify effects return signals from external equipment. A branch output 86 from amplifier 78 is applied to a FET switch 88 (CD4053) as the output lead 90 from effects return transistor 84 is applied to the other contact of FET switch 88 while a common output 92 is connected to a contact of an FET switch 94 (CD4053). The remaining contact of switch 94 is connected to output lead 95 from the remaining effects return amplifier 82. The control leads 96 and 98 receive respective inputs ASW1 and ASW2 to actuate the analog switches thereby to control input on a grid lead 100.

A first amplifier stage consists of dual triode 102a and 102b, a type 12AX7 vacuum tube. Output on lead 100 from analog switch 94 is applied to the grid of triode 102a as the cathode is connected to an R/C parallel combination to ground and the plate is connected through a load resistor 104, 106 to B+ voltage. Output from triode 102a is taken from junction 108 for application to the grid of triode 102b. Triode 102b is then connected as a cathode follower to provide a stage 1 output on lead 110.

Figure 3:
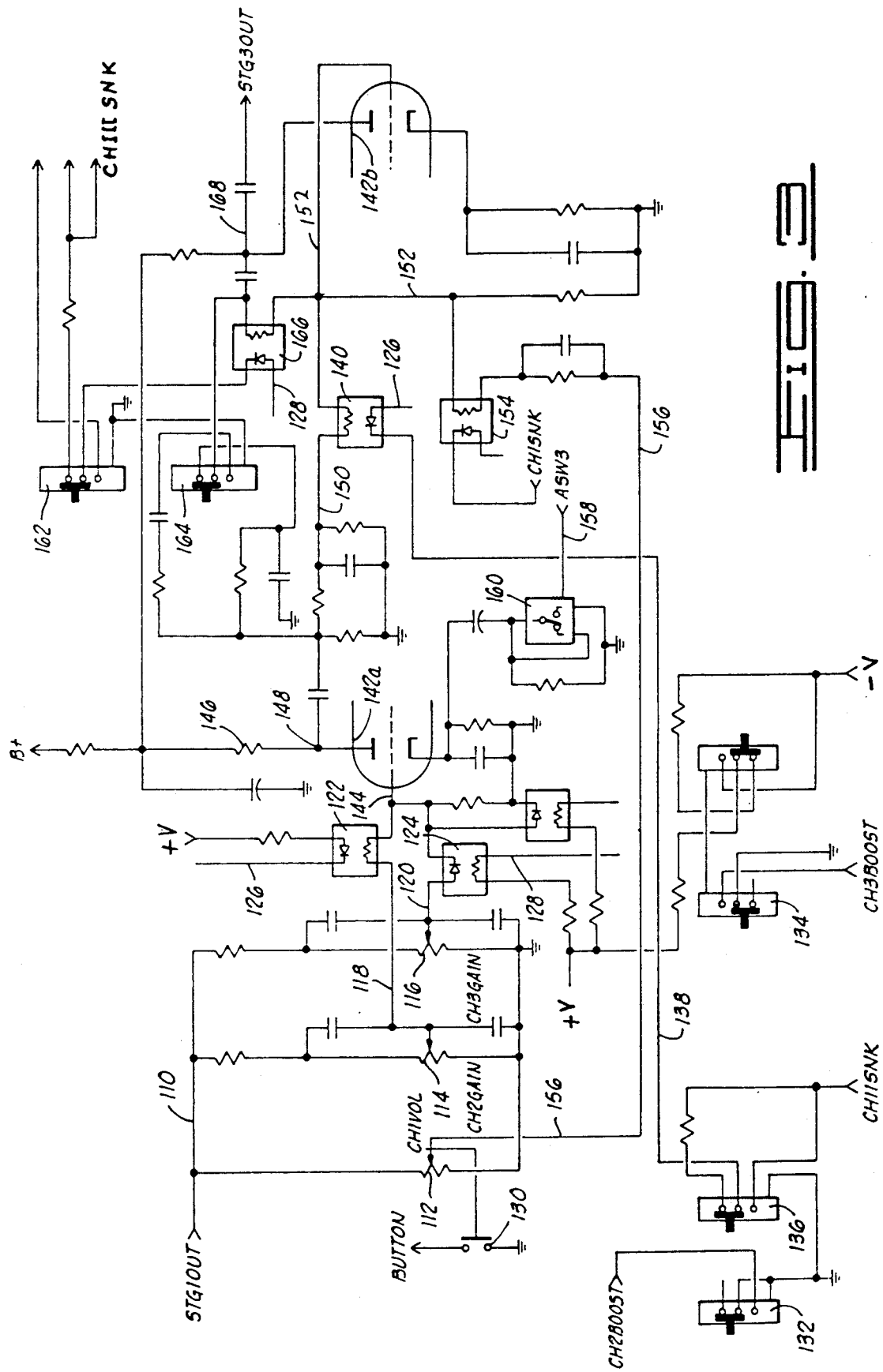
FIG. 3 is a schematic diagram of the second and third stage amplifiers of the present invention.

Referring now to FIG. 3, there are shown the second and third gain stages as they interact with various switching and control circuitry. The stage 1 output present on lead 110 is applied in parallel through a CHANNEL 1 volume potentiometer 112, a CHANNEL 2 gain potentiometer 114 and a CHANNEL 3 gain potentiometer 116. Outputs from potentiometers 114 and 116 on respective leads 118 and 120 are controlled by opto-switches 122 and 124, respectively. The opto-switches are a type VT5C1. The respective light sources of the opto-switches 122 and 124 are controlled by current conduction on leads 126 and 128 which cause illumination of the unit light source.

Thus, it is in the second stage input circuitry where the audio signal is separately processed to bring about three audio channels, CHANNELS 1, 2 and 3, having different signal characteristics. The channels may select the following, for example:
CHANNEL 1—"clean" guitar sounds;
CHANNEL 2—"CRUNCH" sounds; and
CHANNEL 3—"lead/overdriven" sounds.

A front panel pushbutton switch 130 provides a BUTTON output which is applied as input to pin 3 of logic device 10 (FIG. 1). Front panel ganged button switches 132 and 134 provide control of CH2BOOST and CH3BOOST, respectively, and button switch 136 connects CH1ISNK with lead 138 to actuate the opto-switch 140. The switches 132/134 are a ganged switch type K12214 SW.

The second and third gain stages are made up of respective halves 142a and 142b of a dual triode, a 12AX7 type vacuum tube. The CHANNEL 2 gain output lead 118 is applied to the grid 144 of triode 142a as the cathode is connected through an R/C bias network to ground. The plate is connected through load resistance 146 to the B+ supply and output is taken from plate junction 148 via lead 150. Second stage output from opto-switch 140 is applied to grid lead 152 of the third gain stage triode 142b. The grid lead 152 is also connected through an opto-switch 154 to a lead 156 which is the output of the CHANNEL 1 volume control potentiometer 112.

Analog switch output from logic device 10, viz. ASW3, is input at lead 158 to control actuation of a FET switch 160 (type CD4053) that changes the cathode to ground impedance of second gain stage triode 142a. Harmonic drive can be varied by control of pushbutton ganged switches 162 and 164 (type K12214 SW) as they function in conjunction with opto-switch 166 to decouple between the plate output lead 168 and the grid lead 152 of third gain stage triode 142b. Thus, the output lead 168 constitutes the stage 3 output.

Figure 4:
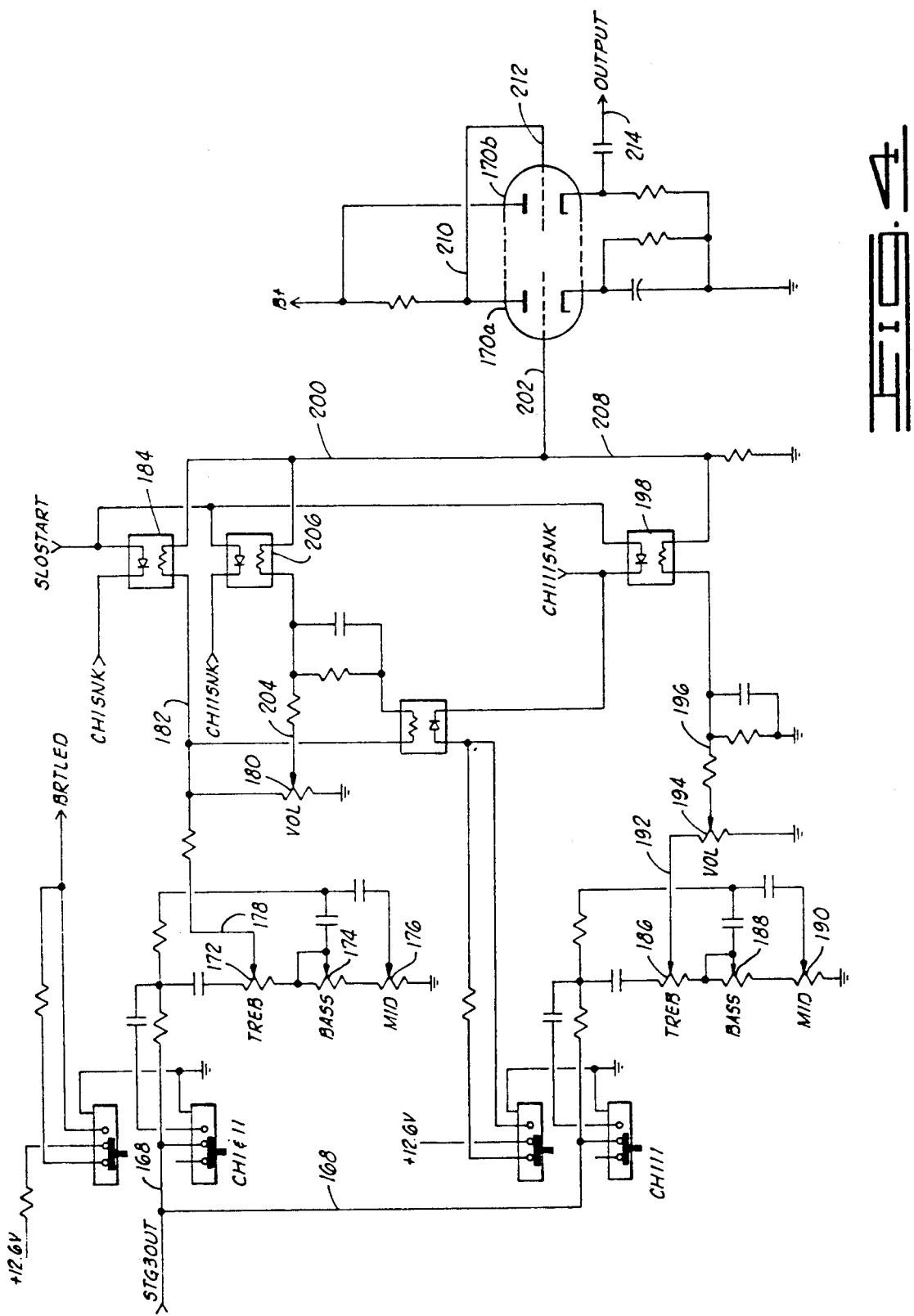
FIG. 4 is a schematic diagram of the power output stage of the programmable pre-amplifier.

Referring now to FIG. 4, stage 3 output on lead 168 is prepared for further logic coupling and input to a final power output amplifier consisting of triode halves 170a and 170b, a 12AU7 type vacuum tube. Signal on lead 168 is applied through series-connected tone control potentiometers 172, 174 and 176, treble, bass and mid-range, respectively. The output signal on wiper lead 178 is then subjected to volume control potentiometer 180 and applied on lead 182 to opto-switch 184.

A parallel portion of stage 3 output on lead 168 is conducted in a CHANNEL 3 mode where it is acted upon by tone control potentiometers 186, 188 and 190, treble, bass and mid-range, respectively. Tone adjusted output on lead 192 then passes through volume control potentiometer 194 and wiper output 196 is applied to opto-switch 198. Thus, with SLOSTART providing current return, the signal CHISNK (FIG. 1) activates opto-switch 184 and output signal is present on lead 200 to grid lead 202 and the grid of triode 170a to provide CHANNEL 1 output. Wiper output from volume control potentiometer 180 on a lead 204 is applied through an opto-switch 206, and application of a CHIISNK signal (FIG. 1) activates opto-switch 206 and provides CHANNEL 2 output on lead 200 and grid lead 202 for amplification in power output stage 170a. Finally, CHANNEL 3 output on lead 196 from volume control potentiometer 194 is switched through opto-switch 198 on application of the CHIIISNK signal (FIG. 1) to produce output on lead 208 to grid lead 202 and the grid of triode half 170a.

The power output amplifier 170 receives output of triode half 170a at plate lead 210 which is directly coupled to grid lead 212 of second half triode 170b, and the cathode of triode 170b is connected for cathode follower output via output lead 214.

The foregoing discloses a unique pre-amplifier design which melds the latterday solid state electronics and its superlative logic capability with the tried and true hard tube electronics which in some cases has been found superior to that which solid state has to offer. In particular, it has been found that the tonal characteristics of hard tube pre-amplifier and amplifier circuitry is often times very desirable as compared to solid state forms of a similar circuit. Therefore, the programmable circuitry functions with the hard tube amplifier stages to produce multiple channels of desirable sounding instrument signals while having the capability of offering greater diversity as regards effects loops, footswitch mixing and other synthesis modes of reproduction. The pre-amplifier also offers a speaker contour filter for simulating diverse response characteristics.

Changes may be made in combination and arrangement of elements as heretofore set forth in the specification and shown in the drawings; it being understood that changes may be made in the embodiments disclosed without departing from the spirit and scope of the invention as defined in the following claims.

What is claimed is:

1. An improved audio signal pre-amplifier comprising:
    an analog signal audio input;
    solid state amplifier and switching circuitry receiving said analog signal audio input and producing a predetermined mix of analog audio output signals;
    a programmable array logic device programmed to produce a plurality of control outputs for control of said solid state switching circuitry; and
    a vacuum tube amplifier having at least one vacuum tube receiving said analog audio output signals to produce an audio pre-amplifier output, said vacuum tube amplifier comprising plural successive vacuum tube stages and a dual triode output amplifier with cathode follower output.

2. An audio signal pre-amplifier as set forth in claim 1 wherein said plural successive vacuum tube stages are further characterized to include:
    a first dual vacuum tube amplifier receiving a first switching input and providing a first stage cathode follower output;
    a second vacuum tube amplifier receiving a second switching input and providing a second stage output; and
    a third vacuum tube amplifier receiving a third switching input and providing a third stage output for input to said dual triode output amplifier.

3. An audio signal pre-amplifier, comprising:
    an analog signal input;
    a programmable array logic device programmed to produce a plurality of control outputs;
    first solid state amplifier and switching circuitry responsive to at least one of said control outputs for receiving said analog signal input and generating a first analog output;
    a first vacuum tube amplifier receiving said first output and producing a first stage output;
    second solid state switching circuitry controlled by selected ones of said control outputs to receive first stage output and produce plural channels of selectively treated second analog signals;
    a second vacuum tube amplifying said plural channels of second analog signals to produce a second stage output;
    third solid state switching circuitry controlled by selected ones of said control outputs to receive second stage output and produce plural, selectively treated third analog signals;
    a third vacuum tube amplifying said third analog signals to produce a third stage output; and
    output means receiving said third stage output and producing an analog audio signal output.

4. An audio signal pre-amplifier as set forth in claim 3 wherein said output means comprises:
    a fourth vacuum tube amplifier receiving said third stage output and producing a fourth output analog signal; and
    a cathode follower stage receiving said fourth output analog signal and producing said analog audio signal output.

5. An audio signal pre-amplifier, comprising:
    input means for receiving an analog signal;
    means, connected to said input means, for providing at least three differently conditioned analog signals in response to an analog signal received by said input means;
    first vacuum tube means for providing a first stage analog output signal;
    a plurality of switches for connecting one of the at least three differently conditioned analog signals to said first vacuum tube means so that the first stage analog output signal is responsive to the connected signal;
    means for providing at least three channels of conditioning of the first stage analog output signal;
    means for providing a pre-amplifier analog output signal in response to one of the at least three channels of conditioned first stage analog output signal, including:
        means for providing a second stage analog output signal, including second vacuum tube means;
        means for providing a third stage analog output signal, including third vacuum tube means; and
        a plurality of switches interconnecting the at least three channels of conditioned first stage analog output signal with said second vacuum tube means and said third vacuum tube means; and
    digital control circuit means, connected to both said pluralities of switches, for controlling both said pluralities of switches so that the pre-amplifier analog output signal is one of at least three differently conditioned versions of the analog signal received by said input means.

6. An audio signal pre-amplifier as set forth in claim 5, wherein said digital control circuit means includes a single programmable array logic device.

7. An audio signal pre-amplifier as set forth in claim 6, wherein said means for providing a pre-amplifier analog output signal further includes:

means for providing differently conditioned third stage analog output signals;

fourth vacuum tube means for providing the pre-amplifier analog output signal in response to one of the differently conditioned third stage analog output signals; and a further plurality of switches, responsive to said digital control circuit means, for selectably connecting one of the differently conditioned third stage analog output signals to said fourth vacuum tube means.

* * * * *